(12) United States Patent
Jeng

(10) Patent No.: US 6,403,428 B1
(45) Date of Patent: Jun. 11, 2002

(54) METHOD OF FORMING SHALLOW TRENCH ISOLATION

(75) Inventor: Pei-Ren Jeng, Hsinchu (TW)

(73) Assignee: Macronix International Co., LTD (TW)

( * ) Notice: Subject to any disclaimer, the term of this patent is extended or adjusted under 35 U.S.C. 154(b) by 0 days.

(21) Appl. No.: 09/788,139

(22) Filed: Feb. 22, 2001

(51) Int. Cl.⁷ .............................................. H01L 21/336
(52) U.S. Cl. ...................................................... 438/294
(58) Field of Search ................................. 438/294, 295, 438/296, 424, 425, 437, 452, 769, 775

(56) References Cited

U.S. PATENT DOCUMENTS

| | | | |
|---|---|---|---|
| 4,794,565 A | | 12/1988 | Wu et al. .................... 365/185 |
| 6,153,480 A | * | 11/2000 | Arghavani et al. .......... 438/296 |
| 6,156,620 A | * | 12/2000 | Puchner et al. ............. 438/400 |
| 6,204,146 B1 | * | 3/2001 | Jenq ............................ 438/424 |
| 6,218,720 B1 | * | 4/2001 | Gardner et al. ............. 257/510 |

OTHER PUBLICATIONS

Naruke et al., "A New Flash–Erase EEPROM Cell with a Sidewall Select–Gate on its Source Side", IEDM Tech. Dig. Dec. 1989, pp. 603–606.

* cited by examiner

Primary Examiner—David Nelms
Assistant Examiner—Quoc Hoang

(57) ABSTRACT

A method of forming the shallow trench isolation by introducing a nitrogen treatment after the step of forming the trench is disclosed. The exposed pad oxide layer located on the upper portion of the trench is transferred into silicon oxynitride layer. Therefore, the formation of the bird's break and electric influence of the device are avoided. Accordingly, the scale down requirement of the future device is also satisfied.

11 Claims, 4 Drawing Sheets

METHOD OF FORMING SHALLOW TRENCH ISOLATION

FIELD OF THE INVENTION

The present invention relates to a method of fabricating a semiconductor device, and more particularly to a method of forming a shallow trench isolation (STI) by introducing a step of treating an oxide layer by nitrogen after the shallow trench is formed by etching.

BACKGROUND OF THE INVENTION

A completed integrated circuit is generally constructed with thousands of metal oxide semiconductor (MOS) transistors. In order to avoid a circuit short between neighbored transistors, an isolation structure is employed for electrical isolating the transistors.

When the circuit integration is increased, size of the electric device must be scaled down. Hence, the isolation structure between the devices also must be scaled down in accordance with the devices, and thereby results in a difficult of forming the isolation structure. A variety of device isolation has been developed, wherein a shallow trench isolation (STI) technique is commonly used, and is currently applied in the integrated circuit process, especially in the sub-half micron integrated circuit process.

Referring o FIGS. 1 through 5, showing, a conventional process of making the shallow trench isolation structure. As shown in FIG. 1, a semiconductor substrate 10, typically a silicon substrate, is provided. A pad oxide layer 12, for example, a silicon oxide layer, is then formed on the semiconductor substrate 10 by heating in an oxygen-containing condition. After that, a silicon nitride layer 14 is then deposited on the pad oxide layer 12 by, for example, LPCVD or other deposition method. A photolithography process is then performed on the wafer.

Referring to FIG. 2, a layer of photoresist is then patterned to expose the silicon nitride layer 14 after the forming step of the silicon nitride 14. A predetermined mask pattern is then transferred to the layer of photoresist to form the photoresist layer 16. Thereafter, an etching process is then performed on the wafer.

Referring to FIG. 3, the formed photoresist layer 16 can be used as the mask during the etching process. The underlying silicon nitride layer 14, pad oxide layer 12 and substrate 10 are then etched sequentially by wet etching or dry etching. Therefore. a trench 20 is then formed on the substrate 10.

Referring to FIG. 4, while the trench 20 has a predetermined depth during the etching process, a liner oxide layer 18 is then conformal formed on the surface of the etched trench 20. The photoresist layer 16 is then removed. Thereafter, a silicon oxide layer 22 is then formed to fill the trench 20 by, for example, CVD or other deposition method. A polishing process is then preformed on the wafer.

Referring o FIG. 5, a CMP process is then applied to remove the silicon nitride layer 14, oxide layer 22, and pad oxide layer 12, exceed the trench 20, and leave the layers located within the trench 20. Since the pad oxide layer is exposed, therefore a bird's break is easily formed in the subsequent processes and the exposed surface of the pad oxide layer is then enlarged, especially in the etching process for patterning the shallow trench.

As described above, a bird's break is easily formed on the pad oxide layer and the exposed surface of the pad oxide layer is then enlarged during the etching process for patterning. This bird's break will occupy the active area result in the difficulty to reduce the size of device.

Moreover, although an improved method is applied to inhibit the forming of the bird's break by etching back the pad oxide layer. However, it is difficult to control the deposition of silicon. Therefore, voids are formed and the electric property of the device is then affected. Accordingly, it is necessary to introduce an effective method to solve this bird's break problem.

SUMMARY

Since a bird's break is easily formed on the pad oxide layer and the exposed surface of the pad oxide layer is then enlarged during the etching process for patterning in the convention method of forming the shallow trench isolation.

It is therefore one aspect of the present invention to provide a method of forming a shallow trench isolation. The present invention comprises the steps of forming a trench on a substrate, wherein the substrate having a stacked structure composed of a pad oxide layer and a silicon nitride layer; forming a liner oxide layer on a sidewall of the trench; and performing a nitrogen treatment to transfer the pad oxide layer into silicon oxynitride layer.

It is another aspect of the present invention to provide a method of forming a shallow trench isolation. The present invention comprises the steps of forming a trench on a substrate, wherein the substrate having a stacked structure composed of a pad oxide layer and a silicon nitride layer; forming a liner oxide layer on a sidewall of the trench; performing a nitrogen treatment to transfer the pad oxide layer into silicon oxynitride layer; and forming a silicon oxide layer to fill the trench.

It is another aspect of the present invention to provide a method of forming a shallow trench isolation. The present invention comprises the steps of forming a pad oxide layer and a silicon nitride layer sequentially on a semiconductor substrate; performing a nitrogen treatment to transfer the pad oxide layer into silicon oxynitride layer; performing a photolithographic step to form a trench on the semiconductor substrate; forming a liner oxide layer on a sidewall of the trench; forming a silicon oxide layer to fill the trench; and performing a polishing step.

As described above, the present invention discloses a method of forming the shallow trench isolation by introducing a nitrogen treatment after the step of forming the trench so that the exposed pad oxide layer located on the upper portion of the trench is transferred into silicon oxynitride layer. Therefore, the method of the present invention avoids the formation of the bird's break and electric influence of the device. Accordingly, the scale down requirement of the future device is satisfied according to the method of the present invention.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention provides a method of forming a shallow trench isolation by introducing a nitrogen treatment after the etching step of forming the shallow trench isolation to nitrifying the exposed pad oxide layer located on the upper edge of the shallow trench isolation and to prevent the bird's break from forming on the upper edge of the shallow trench isolation.

Figure 1:
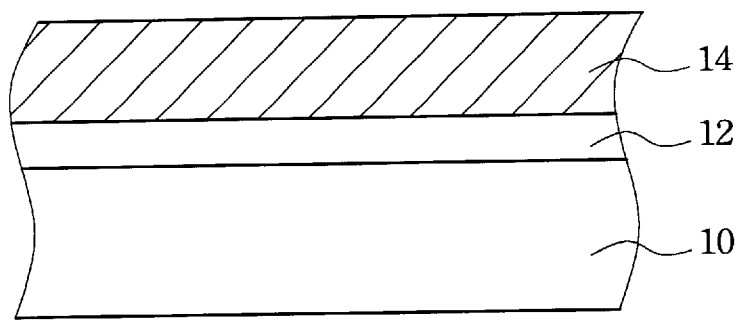
FIGS. 1 to 5 are schematic drawings, showing a conventional process of forming a shallow trench isolation.
Figure 2:
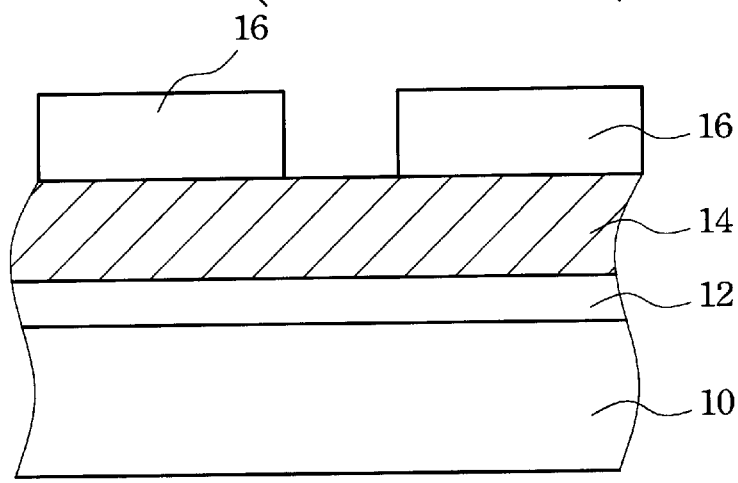
Figure 3:
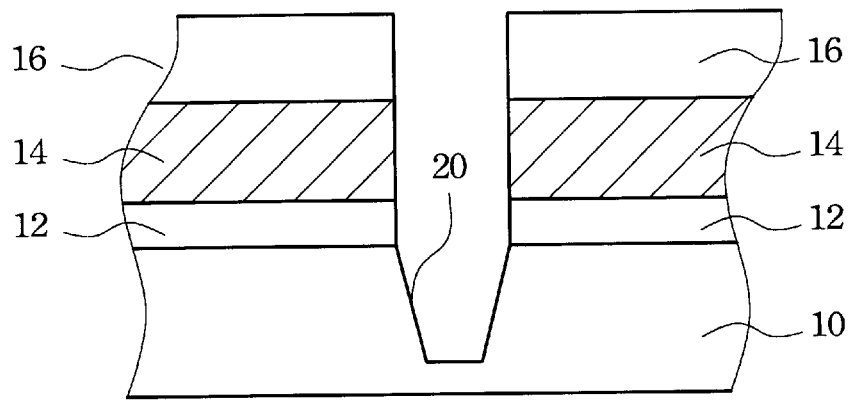
Figure 4:
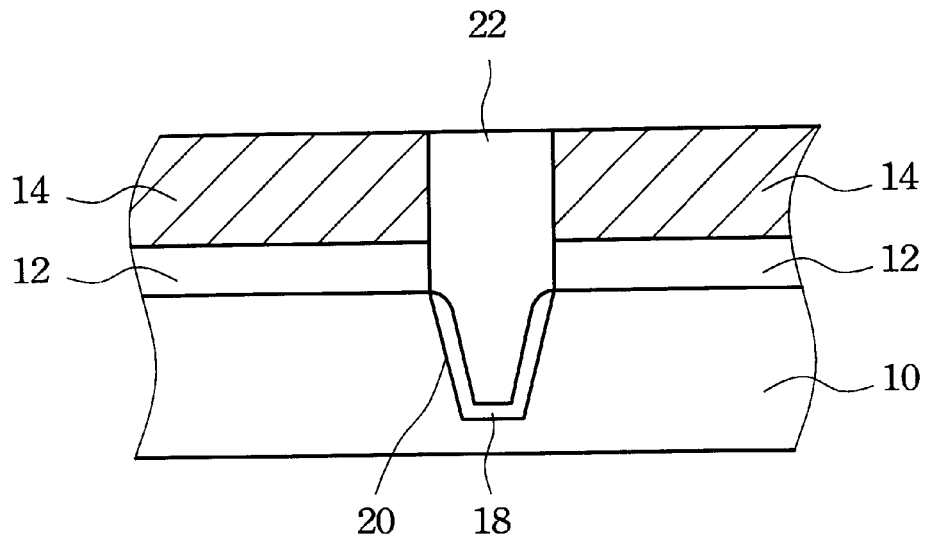
Figure 5:
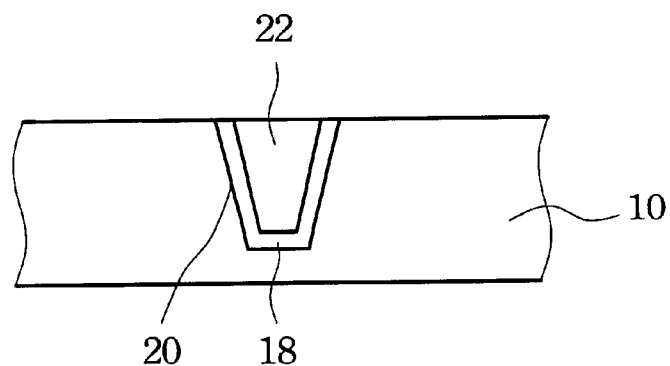
Figure 6:
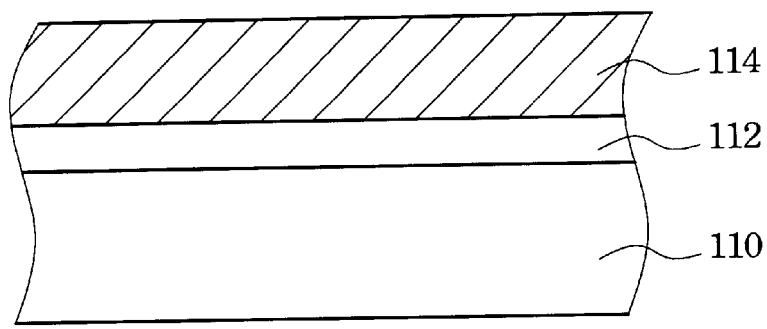
FIGS. 6 to 11 are schematic drawings, showing a method of forming a shallow trench isolation according to the present invention.

Referring to FIGS. 6 through 11, showing a process of forming the shallow trench isolation structure according one preferred embodiment of the present invention. As shown in FIG. 6, a semiconductor substrate 110, for example, a silicon substrate, is provided. A pad oxide layer 112, for example, a silicon oxide layer, is then formed on the semiconductor substrate 110 by heating in an oxygen-containing condition. After that, a silicon nitride layer 114 is then deposited on the pad oxide layer 112 by, for example, LPCVD or other deposition method. A photolithography process is then performed on the wafer.

Figure 7:
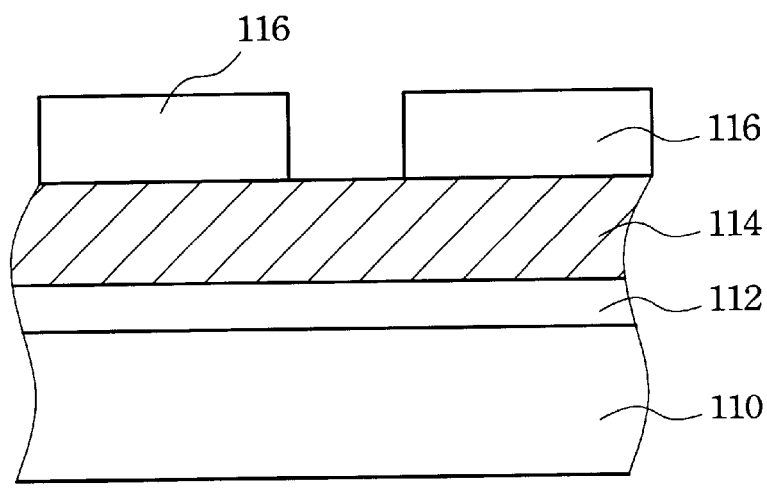

Referring to FIG. 7, a layer of photoresist is then patterned to expose the silicon nitride layer 114 after the forming step of the silicon nitride 114. A predetermined mask pattern is then transferred to the layer of photoresist to form the photoresist layer 116. Thereafter, an etching process is then performed on the wafer.

Figure 8:
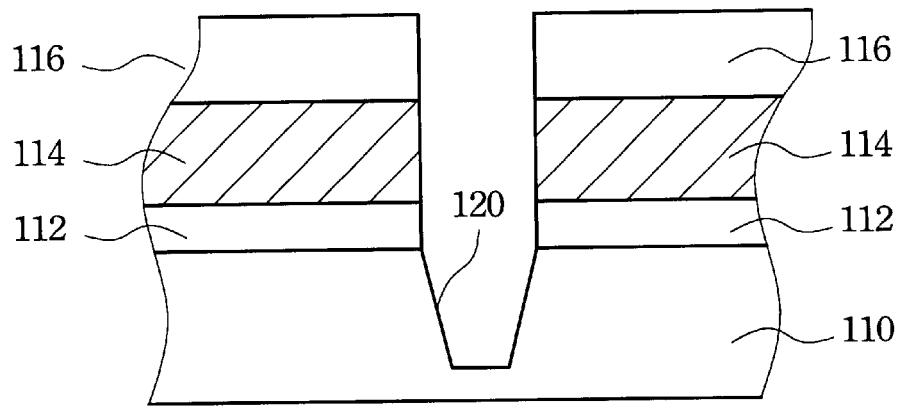

Referring to FIG. 8, the formed photoresist layer 116 can be used as the mask during the etching process. The underlying silicon nitride layer 114, pad oxide layer 112 and substrate 110 are then etched sequentially by wet etching or dry etching, the present invention is not limited thereto, to form a shallow trench 120 on the substrate 110.

Figure 9:
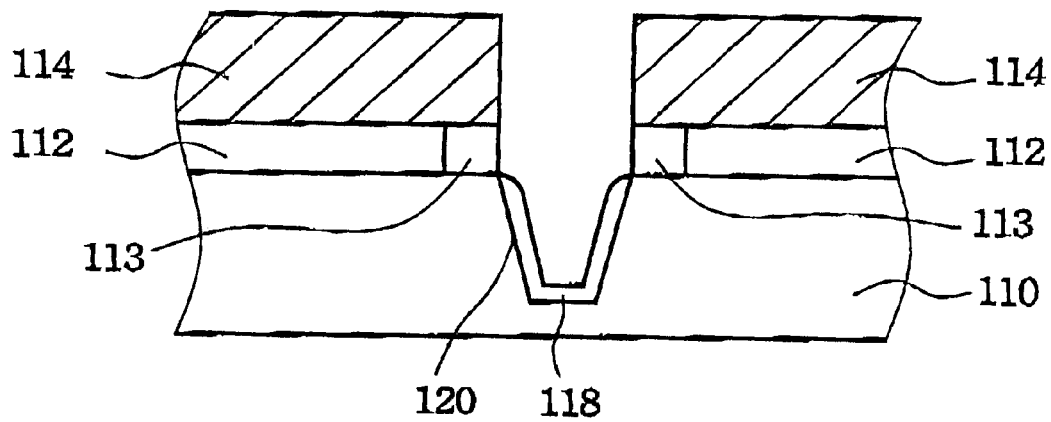

Referring to FIG. 9, while the trench 120 has a predetermined depth during the etching process, the photoresist layer 116 is then removed by ashing. A nitrogen treatment is then performed to nitrify the exposed pad oxide layer 112 by, for example, furnace or RTA (Rapid Thermal Anneal) and to transfer the pad oxide layer into a silicon oxynitride layer, wherein the preferred gas used in the nitrogen treatment is, for example, $N_2$, NO, $N_2O$ or $NH_3$. Thereafter, a liner oxide layer 118 is then conformal formed on the surface of the etched trench 120. It is noted that the gas applied in the present invention is not limited thereto, any gas suitable for the nitrogen treatment is also within the scope of the present invention.

Figure 10:
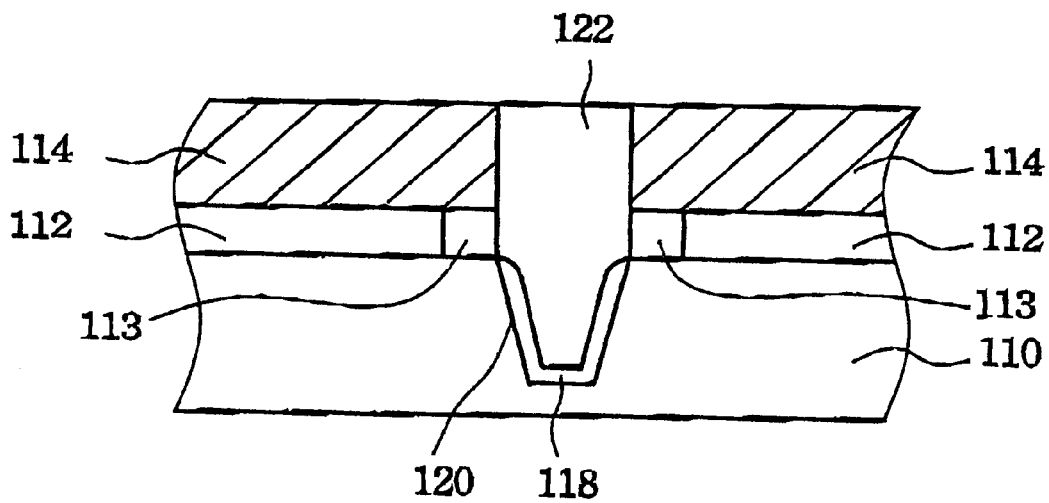

Referring to FIG. 10, a silicon oxide layer 122 is then formed to fill the trench 120 by, for example, CVD or other deposition method. Thereafter, a polishing process is then preformed on the wafer.

Figure 11:
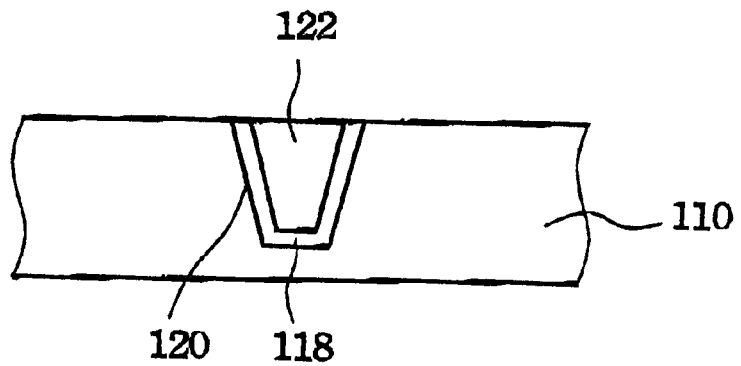

Referring to FIG. 11, a CMP process or other polishing method is then applied to remove the silicon nitride layer 114, silicon oxide layer 122, and pad oxide layer 112. exceed the shallow trench 120, and leave the layers located within the trench 20.

As described above, the present invention discloses a method of forming the shallow trench isolation by introducing a nitrogen treatment after the step of forming the trench, so that the exposed pad oxide layer located on the upper portion of the trench is transferred into silicon oxynitride layer. Therefore, the method of the present invention avoids the formation of the bird's break and electric influence of the device. Accordingly, the scale down requirement of the future device is satisfied according to the method of the present invention.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method of forming a shallow trench isolation, comprising:

forming a trench on a substrate, wherein the substrate having a stacked structure composed of a pad oxide layer and a silicon nitride layer formed thereon;

transferring only a sidewall of the pad oxide layer exposed to the trench into silicon oxynitride by a nitrogen treatment performed thereon;

forming a liner oxide layer on a sidewall of the trench; and forming a silicon oxide layer to fill the trench.

2. The method of claim 1, wherein the step of forming the trench further comprises:

forming the pad oxide layer, the silicon nitride layer, and a photoresist layer in sequence;

performing a photolithography and an etching step to form the trench; and removing the photoresist layer.

3. The method of claim 1, wherein the nitrogen treatment is performed in a furnace.

4. The method of claim 3, wherein the nitrogen treatment utilizes a gas selected from a group composed of $N_2$, NO, $N_2O$, and $NH_3$.

5. The method of claim 1, wherein the nitrogen treatment comprises a rapid thermal anneal step.

6. The method of claim 5, wherein the nitrogen treatment utilizes a gas selected from a group composed of $N_2$, NO, $N_2O$, and $NH_3$.

7. A method of forming a shallow trench isolation, comprising:

forming a pad oxide layer and a silicon nitride layer sequentially on a semiconductor substrate;

performing a photolithographic step to form a trench on the semiconductor substrate;

transferring only a sidewall of the pad oxide layer exposed to the trench into silicon oxynitride by a nitrogen treatment performed thereon;

forming a liner oxide layer on a sidewall of the trench;

forming a silicon oxide layer to fill the trench; and performing a polishing step.

8. The method of claim 7, wherein the nitrogen treatment is performed in a furnace.

9. The method of claim 8, wherein the nitrogen treatment utilizes a gas selected from a group composed of $N_2$, NO, $N_2O$, and $NH_3$.

10. The method of claim 7, wherein the nitrogen treatment comprises a rapid thermal anneal step.

11. The method of claim 10, wherein the nitrogen treatment utilize a gas selected from a group composed of $N_2$, NO, $N_2O$, and $NH_3$.

* * * * *